United States Patent [19]

Huss et al.

[11] Patent Number: 5,362,243
[45] Date of Patent: Nov. 8, 1994

[54] AIR DATA TRANSDUCER

[76] Inventors: Charles G. Huss, 1022 E. County Rd. 78, Shakopee, Minn. 55379; Kenneth J. Freeman, 1392 Cosmos La., Eagan, Minn. 55123

[21] Appl. No.: 158,733

[22] Filed: Nov. 30, 1993

Related U.S. Application Data

[63] Continuation of Ser. No. 938,802, Sep. 1, 1992, abandoned.

[51] Int. Cl.⁵ .............................................. H01R 9/09
[52] U.S. Cl. ...................................... 439/76; 361/749; 439/77
[58] Field of Search ................ 439/67, 76, 77, 620; 361/398, 395, 399, 413, 749, 681

[56] References Cited

U.S. PATENT DOCUMENTS

| | | | |
|---|---|---|---|
| 3,552,754 | 1/1971 | Bow | 285/192 |
| 3,602,869 | 8/1971 | Metz et al. | 439/191 |
| 3,873,889 | 3/1975 | Leyba | 361/392 |
| 4,342,883 | 8/1982 | Wernet et al. | 361/398 |
| 4,867,706 | 9/1989 | Tang | 439/620 |
| 4,981,311 | 1/1991 | Kinney | 285/918 |
| 5,030,793 | 7/1991 | McCarthy | 174/35 R |
| 5,082,457 | 1/1992 | Wollscheidt et al. | 439/620 |

FOREIGN PATENT DOCUMENTS

| | | | |
|---|---|---|---|
| 2631748 | 11/1989 | France | 439/620 |
| 4037603 | 5/1991 | Germany | 439/620 |

OTHER PUBLICATIONS

Rosemount Inc. Drawing No. 01281-1088 (admitted prior art).

*Primary Examiner*—Neil Abrams
*Attorney, Agent, or Firm*—Judson K. Champlin; Richard A. Romanchik

[57] ABSTRACT

An air data module connector and filter that provides a shielded housing 12 for supporting a standard air data signal carrying cable connector 22 on an exterior wall thereof, and having an access opening that has a cover plate 34 on an opposite wall from the mounting wall for the connector. The cover plate 34 has a plurality of tubular filters 36 installed therein with pins 40 extending into the housing toward the cable connector. A flexible circuit board 44 has opposite ends which fit on the pins of the connector 23, and the pins 40 of the filters 36 extending through the cover plate, respectively, so that the flexible circuit board 44 can be installed on the cable connector 23 and on the pins 40 for the filters on the cover plate 34 prior to assembly of the cable connector and the cover plate 34 in the housing 12.

5 Claims, 3 Drawing Sheets

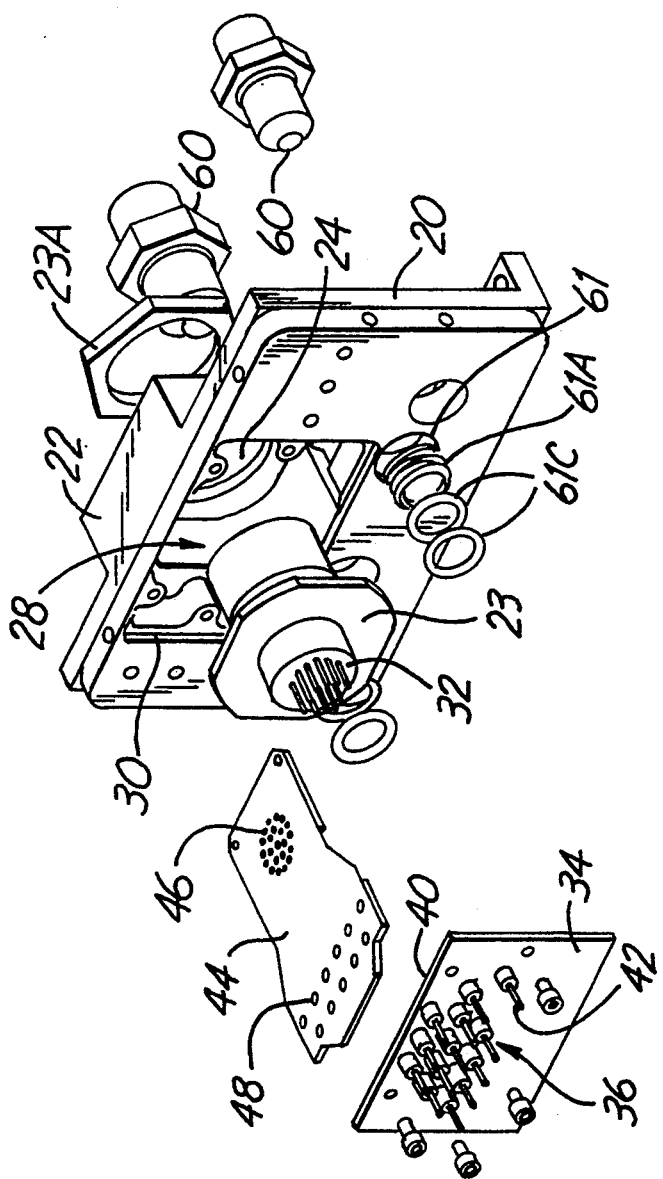
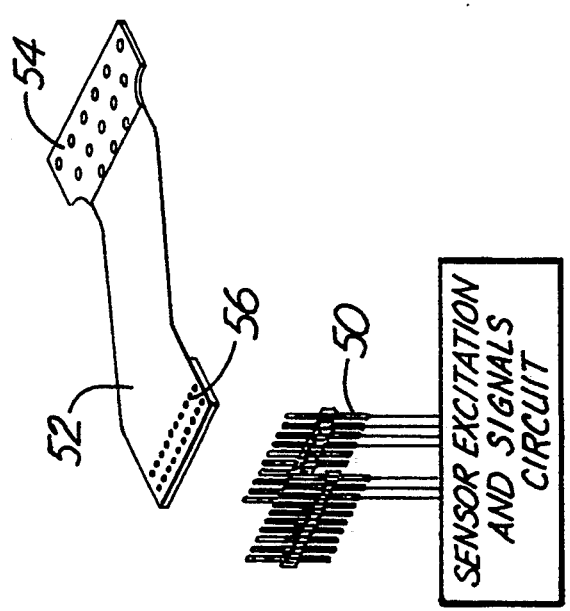
Fig. 2

AIR DATA TRANSDUCER

This is a continuation of application Ser. No. 07/938,802, filed Sep. 1, 1992, now abandoned.

BACKGROUND OF THE INVENTION

The present invention relates to a module connector and filter package that makes the connection between the connectors from air data pressure sensors and through filters to a cable for shielded cables cords leading to on-board computers and other instrumentation.

Electromagnetic interference filters are well-known in the art, and are used in air data sensor circuitry. However, to date, these filters have been permanently installed through walls of a housing supporting the sensors and other connections, and the making of the connections from the standard cable connectors utilized to the filters, and then from the filters to circuitry internal to the housing, is time consuming and involves difficult assembly procedures.

SUMMARY OF THE INVENTION

The present invention relates to a connection module for use in air data sensing systems which permits connecting a number of line filters into the individual carrying conductors from air data pressure sensors mounted in a main housing to filter out electromagnetic interference (EMI) in a simplified manner which lends itself well to rapid assembly, while gaining the benefit of having the connections, and flexible connecting circuit boards shielded on the output side of the filters. A small connecting housing is provided on a removable end wall on the main housing for supporting and enclosing the components. While standard connectors and flexible circuit boards are used, the arrangement gives a compact, easily assembled package for use with air data sensors.

BRIEF DESCRIPTION OF THE DRAWINGS

FIG. 2 is an exploded perspective view of a connector assembly illustrating a filter for filtering out electromagnetic interference and schematically showing flexible circuit boards coupled thereto;

DETAILED DESCRIPTION OF THE PREFERRED EMBODIMENTS

Figure 1:
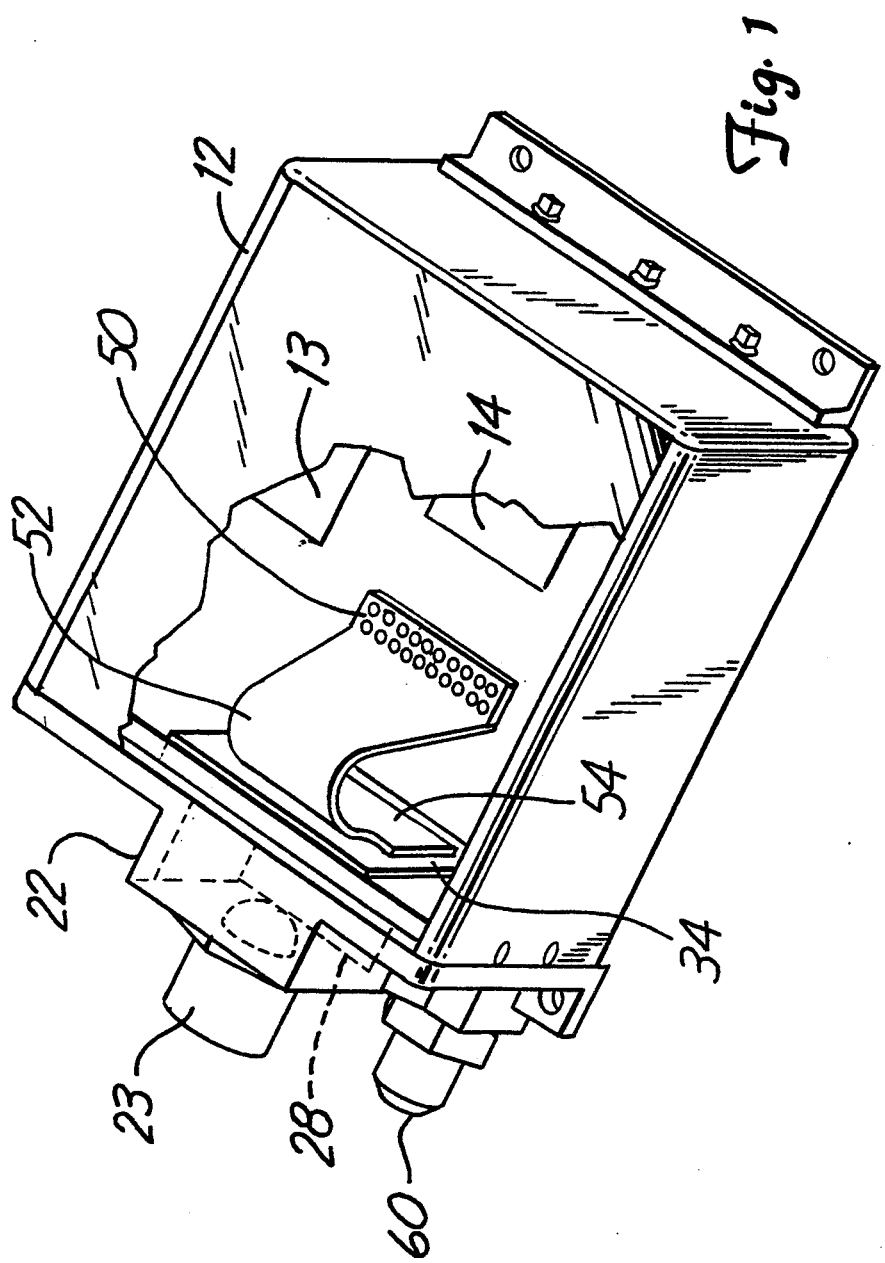
FIG. 1 is a perspective view of air data module housing with parts broken away.

Referring to FIG. 1, a main housing 12 is an air data sensing module for housing pressure sensors 13 and 14 in an air vehicle for determining air data parameters. The sensors 13 and 14 are of a desired type and have electrical circuitry to sense the pressure and provide output signals. The main housing 12 has a removable end wall that has an auxiliary housing 22 formed on an outer side thereof which supports an electrical connector 23 in a suitable manner connector 23 has an output connection for shielded cabling leading to remote instruments (not shown).

Figure 3:
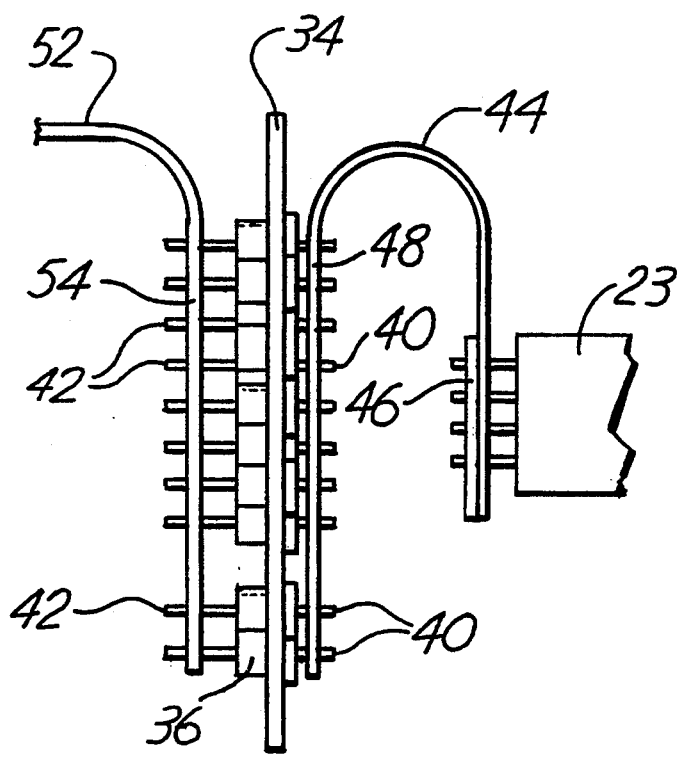
FIG. 3 is a fragmentary enlarged side elevational view of the filter assembly and circuit board connections shown in FIG. 1.
Figure 4:
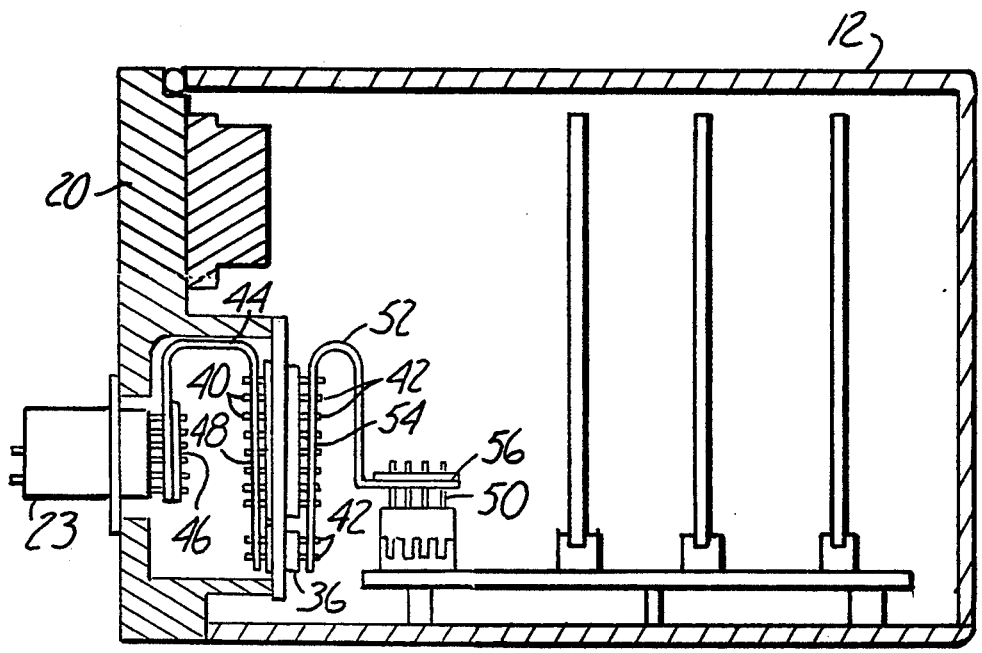
FIG. 4 is a sectional view of the air data module housing shown in FIG. 1.

As shown in FIGS. 2 and 4, the electrical connector 23 is mounted within in a cavity 28 in the auxiliary housing 22. The cavity 28 has a rectangular opening indicated at 30 leading to the interior of the main housing 12. When the connector 23 is assembled in the auxiliary housing, the pins 32 of the electrical connector 23 are recessed in the cavity 28 so that they extend only a short distance from the outer wall of auxiliary housing 22 which defines cavity 28. The opening 30 is configured to receive a cover plate 34 thereon. The cover plate 34 comprises the support for electromagnetic interference (EMI) filters. These filters as shown in FIGS. 2 and 3 comprise individual tubes 36, each of which contains a ferrite bead and a variable-size feed-through capacitor providing selectable signal attenuation, depending on the application requirements. Each of these tubes 36 is soldered into the cover plate 34 through a suitable size opening. The tubes 36 have electrical connector pins 40 on one side of the filter facing into the recess 28, and these connector pins are shown in FIG. 1. The opposite facing end of the individual tubes 36 each has a connector pin 42 protruding therefrom. Each EMI filter is on the inside of a respective tube 36 with an output side of the filter being the pins 40 and the input side of the filter comprising the pins 42.

In order to provide ease of connection to the connector pins 32, a flexible circuit board 44 is provided. Circuit board 44 has suitable conductive paths thereon with one pin receptacle pattern connector 46 at one end corresponding to the pins at the pin end 33 of the connector 23, and the other end of the flexible circuit board has a connector with a pin receptacle pattern 48 which corresponds to the pattern of the pins 40, as shown generally and schematically in FIG. 1. The input side of the EMI filters in tubes 36 is connected to a pin array shown schematically at 50 through the use of a flexible circuit board 52 which has one end with a connector housing pin receptacle pattern 54 that corresponds to the pin pattern of the pins 42. An opposite end of the flexible circuit board 52 is provided with a connector housing pin receptacle pattern indicated at 56 that corresponds to the pattern of pins 50. The pins 50 are connected to the pressure sensors 13 and 14, and/or temperature sensors for providing data needed to operate an air vehicle by plugging into fixed circuit boards in main housing 20.

The auxiliary housing 22, flexible circuit boards and the plate mounting of the EMI filters provide for a very rapid way of installing EMI filters into a compact space. The housing end wall having an auxiliary housing 22 which fastens onto the housing in a suitable manner permits connecting the filters to flexible circuit boards before being fixed in the main housing. Once installed the cover 34 and supported EMI filters are securely held in place on the housing 20. The cover 34 is electrically coupled to the housing 20 when installed in place to provide shielding.

The electrical connector 23, the cover plate 34 with the filters 36 in place, and the flexible circuit board 44 can be formed as a subassembly, along with the flexible circuit board 52.

The connector 23, the flexible circuit board 44, the plate 34 with the filters 36 in place, and the flexible circuit board 52 with connector receptacles 54 in place can be placed onto a bench, and the connector end having the receptacle pattern 54 can be slipped over the outlet pins 42 of the filters 36 and soldered in place. The cable connector 23 then can be placed onto the receptacles of flexible circuit board 44 having the pin pattern 46 and also soldered in place and connector end 48 is soldered to pins 40 to complete the subassembly. The pins 50 can be soldered in place in connector pattern 56 on flexible circuit board 52.

The cable connector 23 can then be slipped into the opening shown at 24 at the back of the auxiliary housing 22, and a nut 23A used for fastening the connector in place.

The cover plate 34 is then installed with suitable screws to cover the opening of the auxiliary housing to cover to receptacle and provide shielding.

The flexible circuit board 44 will accommodate positioning the cable connector 23 in place, and there will be clearance between the ends of the pins 32 and the ends of the pins 40 on the filters 36.

Suitable input pressure connections are shown at 60, and can be installed in provided openings such as the one shown at 61 on the front wall 20 of the main housing. Then the end wall can be put into place on housing 12. The free end of flexible circuit board 52 and pins 50 all form connection to circuits for the pressure sensors 13 and 14. The pressure connectors 60 are connected to the pressure sensor 13 and/or 14 on the interior of the main housing 12.

The flexible circuit board 52 is of sufficient length to permit the pins 50 to be connected or plugged into pin receptacles on circuit boards carrying components for the sensing circuits used with sensors 13 and 14. Thus, the final assembly is without soldering in that pins 50 are slipped into receptacles and cable connector 23 is held in place with a nut.

The flexible circuit boards permit ease of assembly for installation of the assembly into the transducer, and greatly simplify connecting in EMI filters. The output end of the cable connector 23, of course, will be connected to a shielded cable leading to remote instrumentation.

As shown in FIG. 2, the pressure connection from input connectors 60 to pressure sensor 13 and/or 14 is made by using opening 61 which receives sleeve 61A and elastic O-rings 61C. When assembled in opening 61, the O-rings 61C provide pressure seals. The pressure connection mentioned above is used to couple two pressure sensors 13,14 from the front end wall 20.

The cover plate 34 is made by having holes for the tubes of the EMI filters and then soldering the tubes for the filters in place.

Although the present invention has been described with reference to preferred embodiments, workers skilled in the art will recognize that changes may be made in form and detail without departing from the spirit and scope of the invention.

What is claimed is:

1. An air data module connector and filter package comprising:

a mounting wall for a main housing packaging air data sensors, said mounting wall having an auxiliary housing defined thereon forming a cavity, and having an opening for receiving a standard electrical cable connector;

individual electrical connector means on said electrical cable connector for each of a plurality of lines;

a cover plate for removably covering the cavity of said auxiliary housing on an inner side of the mounting wall, said cover plate having a plurality of single line filter means mounted thereon, said filter means having a first single pin facing on one side of the cover plate, and a second single pin connector on an opposite side of said cover plate;

a flexible circuit board means mountable within said auxiliary housing and having first connectors having receptacles for receiving and connecting to respective electrical connector means of said standard electrical connector, and a second connector having receptacles for receiving the first pins of each of the filter means on said plate, said flexible circuit board folding and fitting within said auxiliary housing cavity when the cover plate is covering the cavity; and a second flexible circuit board means having receptacles for receiving each of the second pins of said filter means extending from the opposite side of the cover plate from the auxiliary housing cavity, and an opposite end of said second flexible circuit board having means for receiving second electrical connectors for connection to an air sensor.

2. The package of claim 1 wherein said cover plate is of substantially smaller size than the size of said mounting wall.

3. The package of claim 1 and pressure sensor means mounted in the main housing, the second electrical connector means comprising third pins for providing and receiving signals from the pressure sensor means.

4. The package of claim 3 and pressure connection for the pressure sensor means mounted through said end wall.

5. The package of claim 1 wherein the filter means comprise outer tubes sealingly passing through the cover plate.

* * * * *